(12) United States Patent
Raul et al.

(10) Patent No.: US 7,376,876 B2
(45) Date of Patent: May 20, 2008

(54) TEST PROGRAM SET GENERATION TOOL

(75) Inventors: Rabindra Nath Raul, Puri (IN);
Rajaah K. Vasudevan, Bangaloro (IN);
Ranga A. Udipi, Bangalore (IN)

(73) Assignee: Honeywell International Inc., Morristown, NJ (US)

( * ) Notice: Subject to any disclaimer, the term of this patent is extended or adjusted under 35 U.S.C. 154(b) by 516 days.

(21) Appl. No.: 11/021,410

(22) Filed: Dec. 23, 2004

(65) Prior Publication Data
US 2006/0156137 A1    Jul. 13, 2006

(51) Int. Cl.
*G01R 31/28* (2006.01)
(52) U.S. Cl. ........................... 714/738
(58) Field of Classification Search .............. None
See application file for complete search history.

(56) References Cited

U.S. PATENT DOCUMENTS

| | | |
|---|---|---|
| 4,542,505 A | 9/1985 | Binoeder et al. |
| 4,577,318 A | 3/1986 | Whitacre et al. |
| 4,620,302 A | 10/1986 | Binoeder et al. |
| 4,701,916 A | 10/1987 | Naven et al. |
| 4,853,928 A | 8/1989 | Williams |
| 4,926,363 A | 5/1990 | Nix |
| 4,932,028 A | 6/1990 | Katircioglu et al. |
| 5,218,325 A | 6/1993 | Trelewicz et al. |
| 5,323,108 A | 6/1994 | Marker, III et al. |
| 5,369,604 A | 11/1994 | Ravindranath et al. |
| 5,390,194 A | 2/1995 | Mannle |
| 5,418,792 A | 5/1995 | Maamari |
| 5,548,525 A | 8/1996 | Albee et al. |
| 5,633,813 A | 5/1997 | Srinivasan |
| 5,657,240 A | 8/1997 | Chakradhar et al. |
| 5,677,913 A | 10/1997 | Aybay |
| 5,684,808 A | 11/1997 | Valind |
| 5,715,373 A | 2/1998 | Desgrousilliers et al. |
| 5,812,436 A | 9/1998 | Desgrousilliers et al. |
| 5,850,511 A | 12/1998 | Stoecker et al. |
| 5,875,196 A | 2/1999 | Chakradhar et al. |
| 5,892,947 A | 4/1999 | DeLong et al. |
| 5,913,023 A | 6/1999 | Szermer |
| 6,112,020 A | 8/2000 | Wright |
| 6,128,759 A | 10/2000 | Hansen |
| 6,178,533 B1 | 1/2001 | Chang |
| 6,182,258 B1 | 1/2001 | Hollander |
| 6,219,809 B1 | 4/2001 | Noy |
| 6,334,200 B1 | 12/2001 | Fujiwara et al. |
| 6,341,361 B1 | 1/2002 | Basto et al. |
| 6,347,388 B1 | 2/2002 | Hollander |
| 6,353,904 B1 | 3/2002 | Le |
| 6,378,096 B1 | 4/2002 | Chakradhar et al. |
| 6,449,744 B1 | 9/2002 | Hansen |
| 6,519,727 B2 | 2/2003 | Noy |
| 6,523,151 B2 | 2/2003 | Hekmatpour |

(Continued)

FOREIGN PATENT DOCUMENTS

JP    05150009 A  *  6/1993

*Primary Examiner*—Shelly Chase
*Assistant Examiner*—Steven D Radosevich
(74) *Attorney, Agent, or Firm*—Fogg & Powers LLC

(57) ABSTRACT

A test specification and test program set for a given unit under test and a given automated test equipment platform is generated in an automated manner using information stored in a repository.

27 Claims, 11 Drawing Sheets

U.S. PATENT DOCUMENTS

| | | |
|---|---|---|
| 6,546,506 B1 | 4/2003 | Lewis |
| 6,631,344 B1 | 10/2003 | Kapur et al. |
| 6,675,138 B1 | 1/2004 | Hollander et al. |
| 6,684,359 B2 | 1/2004 | Noy |
| 6,701,313 B1 | 3/2004 | Smith |
| 6,711,134 B1 | 3/2004 | Wichelman et al. |
| 6,714,032 B1 | 3/2004 | Reynick |
| 2002/0073374 A1* | 6/2002 | Danialy et al. ............. 714/738 |
| 2005/0097515 A1* | 5/2005 | Ribling ...................... 717/124 |

* cited by examiner

| RESOURCE NAME | RESOURCE SIGNAL NAME | SIGNAL TYPE | ACTIONS |
|---|---|---|---|
| POWER SUPPLY | PS-AC1 | POWER SUPPLY | CLOSE, IN, INIT, OPEN, OUT |
| POWER SUPPLY | PS-DC1 | POWER SUPPLY | CLOSE, IN, INIT, OPEN, OUT |
| MULTI I/O | ANALOGIN1 | ANALOG INPUT | INIT, IN |
| MULTI I/O | ANALOGIN2 | ANALOG INPUT | INIT, IN |

FIG. 6

| RESOURCE NAME | RESOURCE SIGNAL NAME | T/R PIN | CON. PIN | IN SWITCH PIN | OUT SWITCH PIN | P.BRD PIN | FP PIN | UUT PIN | UUT SIGNAL NAME |
|---|---|---|---|---|---|---|---|---|---|
| MULTI I/O | ANALOGIN10 | P1-06 | J3-06 | S2-10 | S2-11 | P5-06 | P5-06 | J2-38 | +5VDC BATTERY |
| MULTI I/O | ANALOGIN3 | P1-07 | J3-07 | S2-08 | S2-13 | P5-07 | P5-07 | J2-34 | +15VDC |

FIG. 7

$$VocabREAD$$ $$Main_Pwr.*resistance*$$ between pins $$Main_Pwr.*PinInfo*$$ ($$Main_Pwr.*SignalName*$$) and $$Return.*PinInfo*$$ ($$Return.SignalName$$) using IMPEDANCE_METER
VERIFY $$Main_Pwr.resistance.Lowlimit$$
≤$$Main_Pwr.resistance.Value$$≤$$Main_Pwr.resistance.Highlimit$$

FIG. 8

TEST SPECIFICATION

.
.
.

1.1.1.1.1   Verify no shorts on +15VDC line   1200

Test Procedure - 12345-1234-123
READ *resistance* between pins J2-34 (+15VDC) and J2-42 (Digital Ground) using IMPEDANCE_METER
VERIFY 200 Ohm <= *resistance* <= 1E+19 Ohm

1.1.1.1.2   Verify no shorts on -15VDC line   1200

Test Procedure - 12345-1235-123
READ *resistance* between pins J2-35 (-15VDC) and J2-42 (Digital Ground) using IMPEDANCE_METER
VERIFY 200 Ohm <= *resistance* <= 1E+19 Ohm

TEST PROGRAM SET GENERATION TOOL

TECHNICAL FIELD

The following description relates to testing electrical and electronics equipment in general and to automated testing equipment (ATE) in particular.

BACKGROUND

One way in which electronic equipment is tested is by using automatic test equipment (ATE). In one configuration, such automated test equipment includes a computer, one or more testing resources (such as digital multimeters, waveform analyzers, signal generators, and switching assemblies). An interconnect device is used to communicatively couple a unit under test (UUT) to the ATE (more specifically, to the testing resources included in the ATE). The computer executes a test program set that causes the testing resources to interact with the unit under test in order test the unit under test. The particular testing operations carried out by the test program set are also typically specified in a test specification generated for that particular type of UUT.

The test specification and test program set for a given UUT and ATE platform combination are typically manually created. If the UUT is to be tested using a different ATE platform, a new test specification and test program set are typically manually generated in order to test that UUT using the new ATE platform. If a different UUT is to be tested using the ATE platform, a new test specification and test program set are typically manually generated in order to test the new UUT using that ATE platform.

The ARINC 625-1 standard promulgated by Arinc Inc., among other things, specifies a vocabulary in which a test specification for a given UUT can be expressed in a way that is independent of any particular ATE platform. A test specification expressed in the vocabulary specified in the ARINC 625-1 standard is also referred to here as an "ARINC 625-1 test specification." However, even if an ARINC 625-1 test specification is generated for a given UUT, a different test program set for each UUT/ATE platform combination typically must still be manually generated.

The manual generation of test specifications and test program sets is typically resource intensive (for example, in terms of labor, time, and money).

SUMMARY

In one embodiment, a method comprises retrieving a set of test patterns from a repository associated with a unit under test. Each test pattern specifies, in a predetermined vocabulary, a set of operations to be performed. Each test pattern references a set of logical signal names. The method further comprises retrieving, from the repository, unit under test information about the unit under test. The unit under test information comprises information about a set of unit under test signals supported by the unit under test. The method further comprises generating a test specification comprising a set of test procedures using the set of test patterns and the unit under test information. Each test procedure is generated by instantiating a respective test pattern. Each logical signal name referenced in the respective test pattern is replaced with a respective unit under test signal mapped thereto. Each test pattern specifies a logical testing resource to perform each of the respective set of operations for the respective test pattern. The method further comprises retrieving, from the repository, automated testing equipment information about an automated testing equipment platform. The automated testing equipment information comprises driver information about a set of drivers by which software executing on a host computer included in the automated test platform accesses a set of testing resources included in the automated testing platform. The method further comprises retrieving, from the repository, signal flow information, for the unit under test and the automated testing equipment platform, about coupling resource signals supported by the set of testing resources and unit under test signals supported by the unit under test and generating a test program set comprising a set of test programs. Each test program is generated by translating a respective test procedure into a testing language. Each logical testing resource referenced in the respective test procedure is replaced with a testing resource mapped to the logical testing resource by the automated testing equipment information. For each operation to be performed by that testing resource in accordance with the respective test procedure, the test program invokes, using a respective driver for that testing resource, one or more actions supported by the respective driver in order to implement that operation.

In another embodiment, a system comprises a development computer and a repository communicatively coupled to the development computer. The development computer is operable to retrieve a set of test patterns from a repository associated with a unit under test. Each test pattern specifies, in a predetermined vocabulary, a set of operations to be performed, wherein each test pattern references a set of logical signal names. The development computer is further operable to retrieve, from the repository, unit under test information about the unit under test. The unit under test information comprises information about a set of unit under test signals supported by the unit under test. The development computer is further operable to generate a test specification comprising a set of test procedures using the set of test patterns and the unit under test information. Each test procedure is generated by instantiating a respective test pattern. Each logical signal name referenced in the respective test pattern is replaced with a respective unit under test signal mapped thereto. Each test pattern specifies a logical testing resource to perform each of the respective set of operations for the respective test pattern. The development computer is further operable to retrieve, from the repository, automated testing equipment information about an automated testing equipment platform. The automated testing equipment information comprises driver information about a set of drivers by which software executing on a host computer included in the automated test platform accesses a set of testing resources included in the automated testing platform. The development computer is further operable to retrieve, from the repository, signal flow information, for the unit under test and the automated testing equipment platform, about coupling resource signals supported by the set of testing resources and unit under test signals supported by the unit under test and to generate a test program set comprising a set of test programs. Each test program is generated by translating a respective test procedure into a testing language. Each logical testing resource referenced in the respective test procedure is replaced with a testing resource mapped to the logical testing resource by the automated testing equipment information and, for each operation to be performed by that testing resource in accordance with the respective test procedure, the test program invokes, using a respective driver for that testing resource, one or more actions supported by the respective driver in order to implement that operation.

The details of one or more embodiments of the claimed invention are set forth in the accompanying drawings and the description below. Other features and advantages will become apparent from the description, the drawings, and the claims.

DRAWINGS

FIG. 6 is a block diagram illustrating one example of driver information.

FIG. 7 is a block diagram illustrating one example of signal flow information.

FIG. 8 is a block diagram illustrating one example of a test pattern.

FIG. 10 is a block diagram illustrating one example of a portion of a test specification.

Like reference numbers and designations in the various drawings indicate like elements.

DETAILED DESCRIPTION

Figure 1:
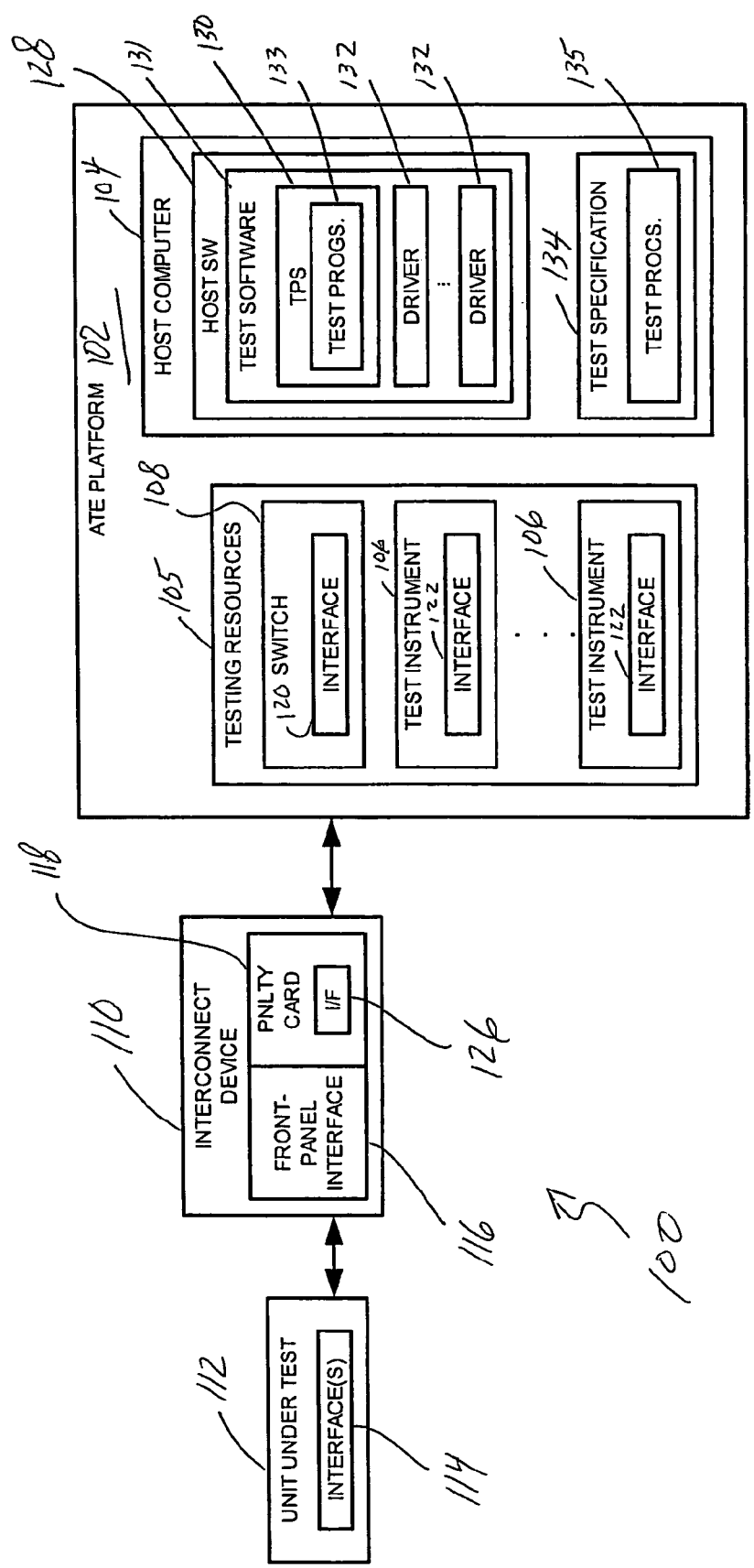
FIG. 1 is a block diagram illustrating one exemplary embodiment of an automated test equipment environment.

FIG. 1 is a block diagram illustrating one exemplary embodiment of an automated test equipment (ATE) environment 100. Embodiments of the systems, devices, methods, and techniques described here can be used as, with, in or on embodiments of the ATE environment 100 shown in FIG. 1. In the embodiment shown in FIG. 1, the environment 100 comprises an automated test equipment platform 102. The ATE platform 102 comprises a computer 104 (also referred to here as the "host computer" 104) and one or more testing resources 105 including, in the embodiment shown in FIG. 1, test instruments 106 and a switch 108.

The ATE platform 102 is used to test a unit under test 112. The ATE platform 102 is communicatively coupled to the UUT 112 using an interconnect device 110. The unit under test 112 includes one or more interfaces 114 (also referred to here as "UUT interfaces" 114) that are communicatively coupled to one or more front panel interfaces 116 included in the interconnect device 110. In the particular exemplary embodiment shown in FIG. 1, the UUT 112 and the interconnect device 110 both comprise a single UUT interface 114 and front panel interface 116, respectively (though it is to be understood that other numbers of interfaces are used in other embodiments). The front panel interface 116 is selected so as to mate with the UUT interface 114 of the unit under test 112 (for example, using a suitable cable). The interconnect device 110 also includes a unit under test personality card 118 for coupling signals between the testing resources 105 and the front panel interface 116 and for providing, for example, appropriate signal conditioning for the particular UUT 112. The personality card 118 includes an interface 126 (also referred to here as the "personality card" interface 126) that is used to communicatively couple the personality card 118 to the testing resources 105. In one implementation, the front panel interface 116 and the unit under test personality card 118 are user changeable and are selected based on the particular unit under test 112 that is coupled to the interconnect device 110 for testing by the ATE platform 102. In the embodiment shown in FIG. 1, each pin (or other terminal) of the UUT interface 114 of the unit under test 112 is communicatively coupled to a corresponding pin (or other terminal) of the front panel interface 116 and a corresponding pin of the personality card interface 126.

The test instruments 106 include appropriate instruments for generating stimulus for or recording responses from the unit under test 112. Examples of such test instruments 106 include one or more signal generators, digital multimeters, waveform analyzers, and power supplies.

The switch 108 is used to route signals between the test instruments 106 and the interconnect device 110 (and the UUT 112). The switch 108, in the embodiment shown in FIG. 1, is implemented using a crosspoint matrix that is able, under control of the host computer 104, to selectively couple any of a number of "inputs" to any of a number of "outputs." The switch 108 includes an interface 120 (also referred to here as the "switch interface" 120) that is used to communicatively couple the inputs and outputs of the switch 108 to the test instruments 106 and to the UUT personality card 118. In one embodiment, the switch interface 120 of the switch 108 comprises multiple pins (or other terminals). In one implementation of such an embodiment, the switch 108 is implemented using several relay matrix modules. Each of the test instruments 106 include an interface 122 (also referred to here as the "test instrument" interface 122) that is used to communicatively couple the respective test instrument 106 to one or more input pins included in the switch interface 120 of the switch 108. The UUT 112 is communicatively coupled to one or more outputs pins included in the switch interface 120 of the switch 108 (via the UUT interface 114, front panel interface 116, and personality card interface 126). The switch 108, under the control of the host computer 104, routes signals between the test instruments 106 and the UUT 112 (via the interconnect device 110).

The host computer 104 is communicatively coupled to the testing resources 105 using one or more buses or point-to-point links (not shown). The host computer 104 executes software 128 (also referred to here as "host software" 128) that causes the host computer 104 to perform at least a portion of the processing described here as being performed by the host computer 104. Each of the various items of host software 128 described here comprise program instructions that are stored or otherwise embodied on one or more items of computer-readable media such as a local media (such as a local hard disk drive or removable media such as an optical disk) and/or a shared or remote media (such as a network file server).

The host software 128 comprises test software 131. The test software 131 includes a test program set 130 that causes the testing resources 105 to take various actions in order to test the unit under test 112 (for example, to apply signals to and receive signals from the unit under test 112). The test program set 130 is created for a particular UUT 112 and ATE platform 102. The test software 130 also records and analyzes data received from the test instruments 106. The test software 131 and test program set 130 are designed so that the unit under test 112 is tested, by the ATE platform 102, in accordance with a particular test specification generated for that UUT 112. The host software 128 further comprises one or more drivers 132 (implemented, for example, as system-level and/or application-level drivers). Each of the drivers 132 provide a software interface via which the test software 131 and the test program set 130 are able to communicate with the testing resources 105.

In the particular embodiment shown in FIG. 1, one or more test specifications 134 for various UUTs 112 are available via the host computer 104. In the embodiment shown in FIG. 1, each test specification 134 is an ARINC 625-1 specification that is specified in accordance with the ARINC 625-1 standard. In other embodiments, the test specifications are implemented in other ways. In one embodiment, the test specifications 134 are stored on local media (for example, a local hard disk drive or local removable media such as an optical disk) and/or shared or remote media (such as a network file server). The test specifications 134 are available, for example, for viewing by a user of the ATE platform 102 (for example, by displaying a test specification 134 on a computer monitor communicatively coupled to the host computer 104 and/or by printing the specification 134 on a printer communicatively coupled to the host 104). In some other embodiments, one or more of the test specifications 134 shown in FIG. 1 are not available via the host computer 104.

Figure 2:
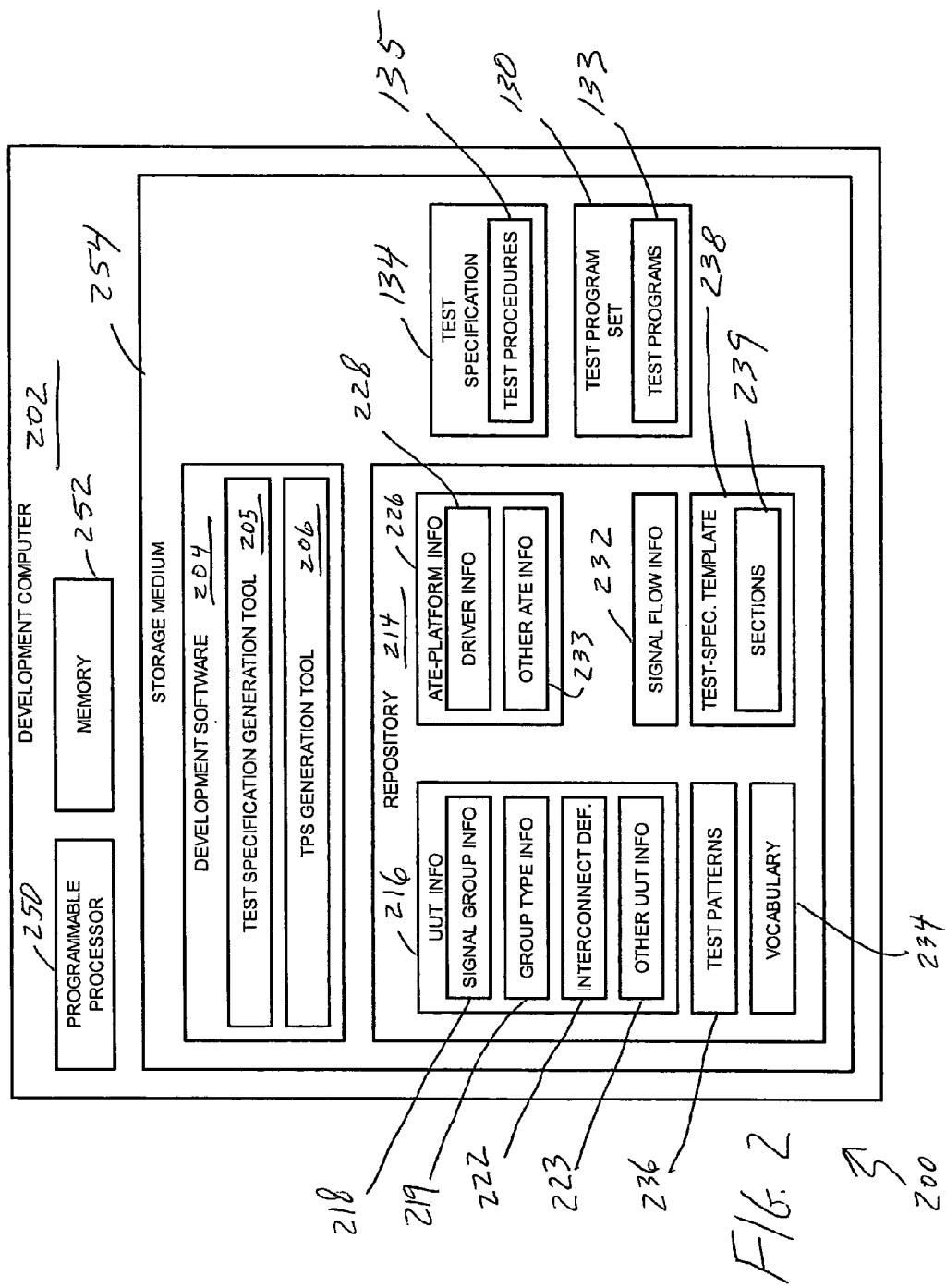
FIG. 2 is a block diagram of one embodiment of a development environment.

The test program set 130 and the test specifications 134 are created using a development environment that is separate from the ATE environment 100. In some other embodiments, the development environment and ATE environment 100 are the same. FIG. 2 is a block diagram of one embodiment of a development environment 200. The embodiment of the development environment 200 shown in FIG. 2 is described here as generating a test program set 130 and a test specification 134 for the UUT 112 and ATE platform 102 of FIG. 1, though other embodiments are implemented in other ways.

The development environment 200 comprises a computer 202 (also referred to here as the "development computer" 202) on which development software 204 executes. The development software 204 causes the development computer 202 to perform at least a portion of the processing described here as being performed by the development computer 202. Each of the various items of development software 204 described here comprise program instructions that are stored or otherwise embodied on one or more items of computer-readable media such as local media (such as a local hard disk drive or removable media such as an optical disk) and/or shared or remote media (such as a network file server). In the particular embodiment shown in FIG. 2, the development computer 202 comprises at least one programmable processor 250 that executes the development software 204 and memory 252 in which at least portion of the development software 204 and any associated data structures are stored during execution. Also, in the particular embodiment shown in FIG. 2, the development computer 202 comprises a storage medium 254 such (as a hard disk drive) on which the repository 214 (described below) is stored. In this embodiment, the development software 204 is also stored on the storage medium 254 (though in other embodiments, the repository and the development software 204 (or a portion thereof) are stored on different media).

In the embodiment shown in FIG. 2, the development software 204 comprises a test specification generation tool 205 and a test program set (TPS) generation tool 206. The test specification generation tool 205 is used to generate a test specification 134 for a given unit under test 112 in an automated manner using information stored in the repository 214. The test program set generation tool 206 is used to generate, for a given unit under test 112 and a given ATE platform 102, a test program set 130 in an automated manner using information stored in the repository 214.

The repository 214 is database (or other data storage mechanism) in which information used to generate a test specification 134 and a test program set 130 is stored. The repository 214 stores various items of information about various signals, ATE platforms and UUTs. In the embodiment shown in FIG. 2, the repository 214 stores information one or more units under test 112 (also referred to here as "UUT information" 216). In the embodiment shown in FIG. 2, the UUT information 216 comprises information about various signals that are supported by each unit under test 112.

Figure 3:
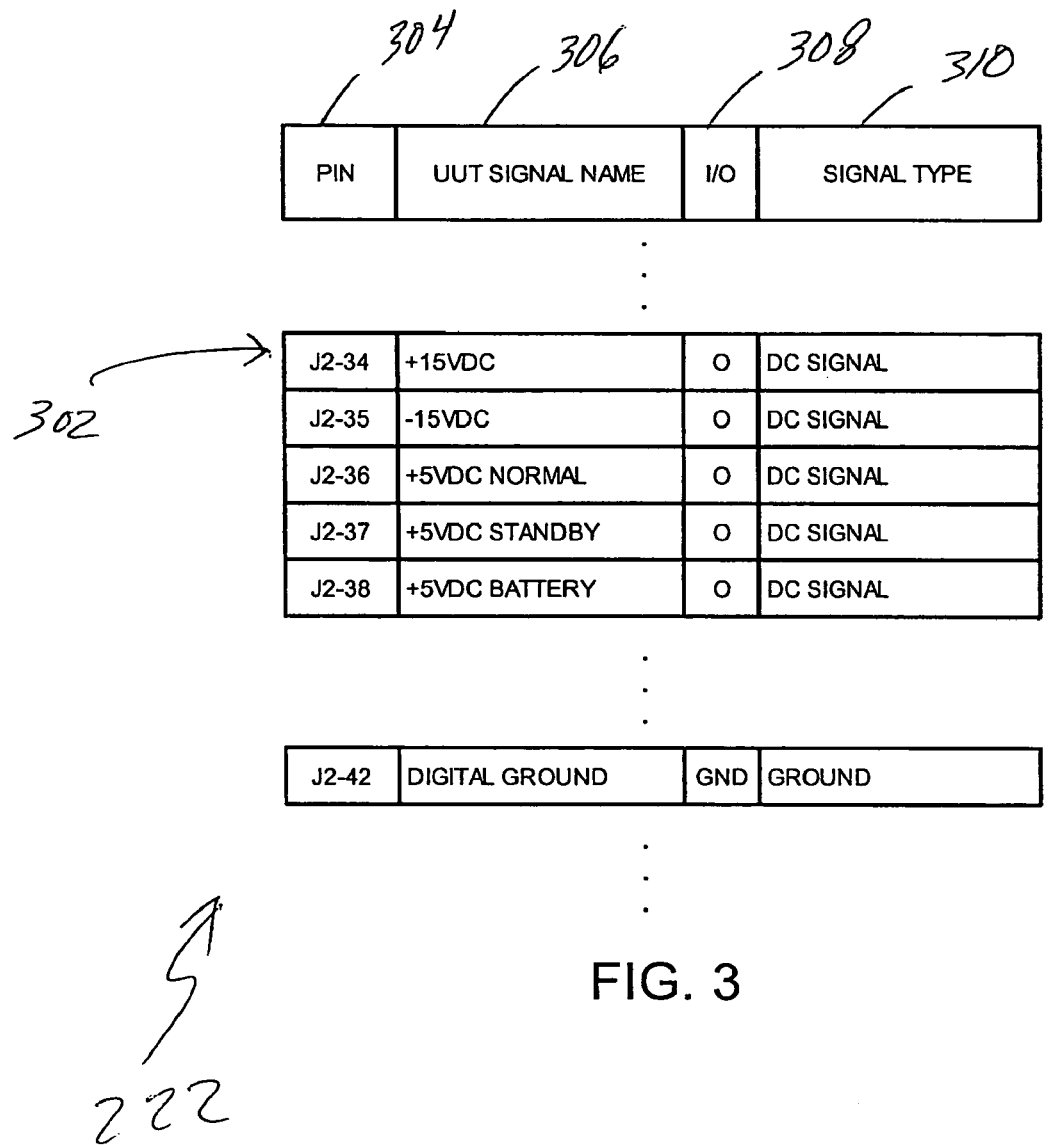
FIG. 3 is a block diagram illustrating one example of a portion of an interconnect definition for a given UUT.

In the embodiment shown in FIG. 2, the UUT information 216 comprises an interconnect definition 222. In one embodiment, the interconnect definition 222 identifies, for a particular UUT, each signal that is supported by the one or more UUT interfaces 114 of that UUT 112. The interconnect definition 222 also identifies, for each signal supported by the UUT interfaces 114, a signal type for that signal and the pin (or other terminal) of the respective UUT interface 114. FIG. 3 is a block diagram illustrating one example of a portion of an interconnect definition 222 for a given UUT 112. In the particular example shown in FIG. 3, the interconnect definition 222 includes an entry 302 for each signal supported by the UUT 112. Each such entry 302 comprises a pin field 304 that identifies the pin in the respective UUT interface 114 to which the signal associated with the entry 302 is mapped, a signal name field 306 that identifies a name for the associated signal, an I/O field 308 that indicates whether the associated signal is an input, output, or both, and a signal type field 310 that identifies a signal type for the associated signal. Although a particular exemplary embodiment of an interconnect definition 222 is shown in FIG. 3, it is to be understood that the interconnect definition 222 in other embodiments, is implemented in other ways (for example, where the interconnection definition 222 contains other information and/or is arranged in other ways).

Figure 4:
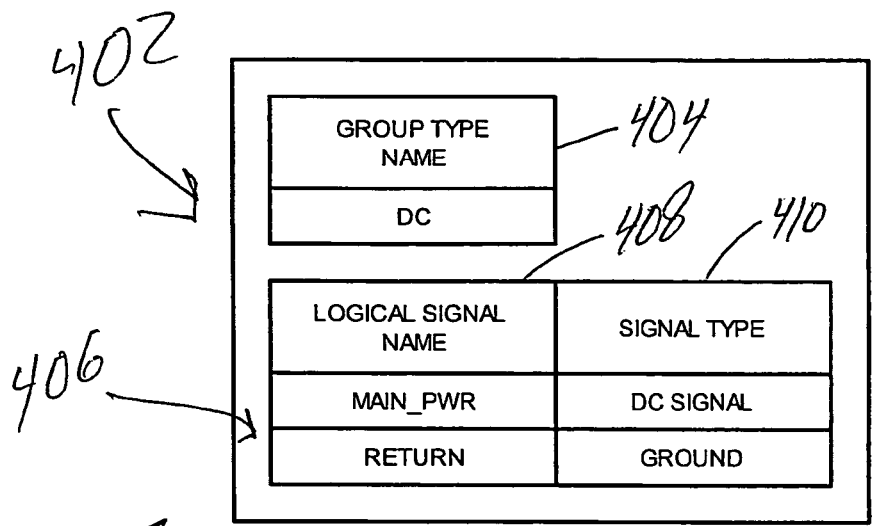
FIG. 4 is a block diagram illustrating one example of group type information.

In the embodiment shown in FIG. 2, the UUT information 216 further comprises signal group information 218. In such an embodiment, the various UUT signals that are supported by a UUT 112 are arranged into various groups (also referred to here as "signal groups"). Each group of UUT signals has an associated group type. Information about various group types (also referred to here as "group type information" 219) is stored in the repository 214. The group type information 219, for each group type, identifies one or more logical signals for that group type and a signal type for each such logical signal. FIG. 4 is a block diagram illustrating one example of group type information 219. Each entry 402 in the group type information 219 includes a group type name field 404 that identifies the name of the group type associated with that entry 402. Also, each entry 402 includes a logical signal entry 406 for each logical signal included in that group type. Each logical signal entry 406 includes a logical signal name field 408 that identifies a name for that logical signal and a signal type field 410 that identifies the signal type of that logical signal.

Figure 5:
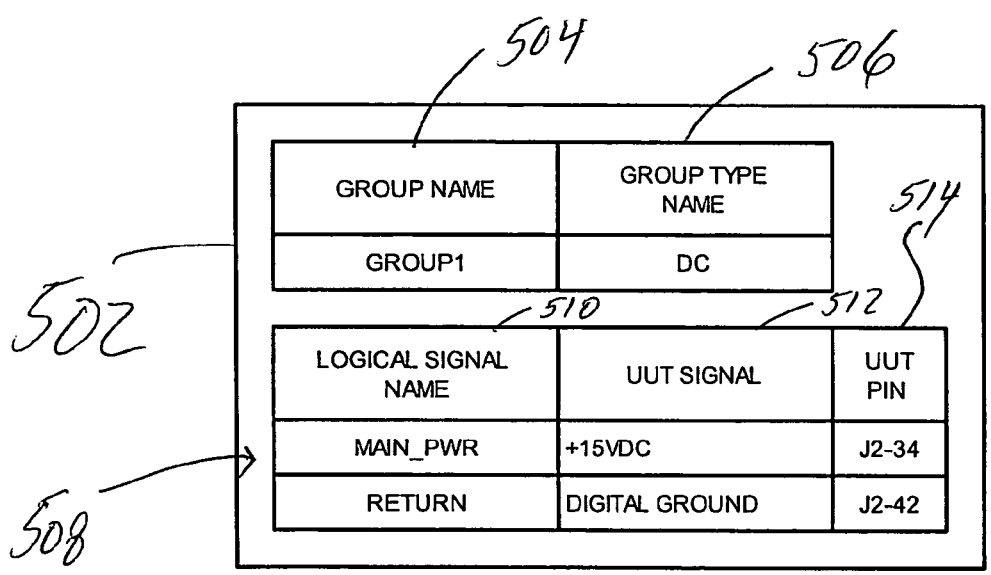
FIG. 5 is a block diagram illustrating one example of signal group information.

Each signal group is an instantiation of the group type associated with that signal group. The signal group information 218 for each signal group maps each logical signal defined for the associated group type to an appropriate UUT signal. FIG. 5 is a block diagram illustrating one example of signal group information 218. The signal group information 218 contains an entry 502 for each signal group. Each entry 502 contains a group name field 504 that identifies the name of that group and a group type field 506 that identifies the group type for that group. Each entry 502 also includes a signal entry 508 for each logical signal in the group type associated with that entry 502. Each signal entry 508 maps each logical signal (identified in a logical signal field 510) in the associated group type to an appropriate UUT signal (identified by the UUT signal name field 512 and UUT interface pin 514) of the appropriate signal type.

Although particular examples of group type information 219 and group information 218 are shown in FIGS. 4 and 5, respectively, it is to be understood that the group type information 219 and group information 218, in other embodiments, is implemented in other ways (for example, contains other information and/or is arranged in other ways).

The UUT information 216 also comprises other information about a respective UUT 112 (also referred to here as "other UUT information" 223). The other UUT information 223, includes for example, a name for the UUT 112, a description of the various connectors used to implement the UUT interface 114 for the UUT 112, or information about other functional attributes of the UUT 112 (for example, particular functions that are and/or are not supported by the UUT 112) and/or physical attributes of the UUT 112 (for example, the size and weight of the respective UUT 112).

The repository 214 also stores information about one or more ATE platforms 102. Such information is also referred to here as "ATE-platform information" 226. The ATE-platform information 226 includes, for each ATE platform 102, information about the various drivers 132 via which the host software 128 executing on a host computer 104 is able to interact with one or more testing resources 105 included in that ATE platform 102. This information is also referred to here as "driver information" 228. In the embodiment shown in FIG. 2, the driver information 228, for each testing resource 105 supported by a particular ATE platform 102, identifies one or more resource signals supported by that testing resource 105, a signal type for that resource signal, one or more actions that the associated driver is able to take for each supported signal type (for example, read the current signal level or value from the associated signal or output a particular signal level or value on the associated signal), and other information about how the host software 128 is able to interact with each driver 132. FIG. 6 is a block diagram illustrating one example of such driver information 228. In the particular example shown in FIG. 6, the driver information 228 includes an entry 602 for each testing resource signal in the respective ATE platform 102. Each such entry 602 includes a resource name field 604 that identifies the particular testing resource that supports the resource signal associated with that entry 602, a resource signal name 606 that identifies the associated resource signal, a signal type field 608 that identifies a signal type for associated resource signal, and an actions field 610 that identifies one or more actions the respective driver 132 is able to perform for the associated resource signal. Although a particular exemplary embodiment of driver information 228 is shown in FIG. 6, it is to be understood that the driver information 228, in other embodiments, is implemented in other ways (for example, contains other information and/or is arranged in other ways).

In other embodiments, the driver information 228 includes other information about the software interface through which test software 128 interacts with the testing resources 105.

The ATE-platform information 226 also comprises other information about a respective ATE platform 102 (also referred to here as "other ATE information" 233). The other ATE information 233, includes for example, a name for the ATE platform 102, a description of the various connectors used to implement the various interfaces supported by the ATE platform 102, or information about other functional attributes of the ATE 102 (for example, particular functions that are and/or are not supported by the UUT 112) and/or physical attributes of the ATE platform 102.

The repository 214 also stores information about how the various signals are routed between an ATE platform 102 and a UUT 112. This information is also referred to here as "signal flow information" 232. The signal flow information 232 maps each resource signal supported by a respective testing resource 105 to an input of the switch 108 and maps one or more UUT signals supported by the UUT 112 to a particular output of the switch 108. The signal flow information 232 defines, for each such testing resource signal, the particular signal path from a respective testing resource interface 122 to the particular the switch interface 120 through any intermediate connectors or interfaces. The signal flow information 232 defines, for each such UUT signal, the particular signal path from a respective UUT interface 114 to the particular the switch interface 120 through any intermediate connectors or interfaces. FIG. 7 is a block diagram illustrating one example of such signal flow information 232. In the particular example shown in FIG. 7, the signal flow information 232 contains an entry 702 for a pair of input and outputs pins of the switch interface 120. Each entry 702 includes an input switch pin field 704 that identifies the pin to which the input associated with that entry 702 is mapped, a testing resource signal name field 706 that identifies the resource signal mapped to the associated input, a testing resource field 708 that identifies the testing resource 105 that supports the testing resource signal associated with that entry 702, testing resource interface pin field 710 that identifies the pin of the respective testing resource interface 122 to which the associated testing resource signal is mapped, and a connector pin field 712 that identifies a pin in a respective connector (that mates with the associated testing resource interface 122) to which the associated resource signal is mapped. Each entry 702 also includes an output switch pin field 720 that identifies the pin to which the output associated with that entry 702 is mapped, a UUT signal name field 722 that identifies the name of the UUT signal associated with that entry 702, a UUT interface pin field 724 that identifies the pin of the respective UUT interface 114 to which the associated UUT signal is mapped, a front panel interface pin field 726 that identifies a pin in the front panel interface 116 to which the associated UUT signal is mapped, and a personality card interface pin field 728 that identifies a pin in the personality card interface 126 to which the associated UUT signal is mapped. Although a particular exemplary embodiment of signal flow information 232 is shown in FIG. 7, it is to be understood that the signal flow information 232, in other embodiments, is implemented in other ways.

The repository 214 also stores one or more test patterns 236. Each test pattern 236 defines a set of operations for a particular test procedure. The repository 214 also stores one or more vocabularies 234. Each vocabulary 234 defines the syntax for the various operations that are used to specify a test pattern 236. Each vocabulary 234 also includes information that indicates how each of the operations are to be implemented using the various actions supported by the testing resources 105. Each test pattern 236 is associated with at least one group type. The one or more signals upon which each test pattern 236 operates are specified using the logical signal names specified in the associated group type (specified in the group type information 219). That is, each test pattern 236 is a function of the logical signals in the group type associated with that test pattern 236. Also, the one or more test instruments 106 that are used to carry out the various operations are specified using a logical resource reference. FIG. 8 is a block diagram illustrating one example of a test pattern 236.

Each test specification 134 generated using the test specification generation tool 205 includes a set of test procedures 135. Each test procedure 135 is an instantiation of a test pattern 236 using a particular group has the same group type as the group type associated with that test pattern 236. Each logical signal specified in the group type with the test pattern 236 is replaced with the UUT signal mapped to that logical signal in the group.

Each test program set 130 generated using the TPS generation tool 206 includes a set of test programs 133. Each test program 133 is an instantiation of a particular test procedure 135 specified in a respective test specification 134. The TPS generation tool 206 translates each of the set of test procedures 135 instantiated for the test specification 134 into a respective test program 133. In one embodiment, each test program 133 is expressed in a suitable high-level testing language that is executed on the host computer 104 in order to test a respective UUT 112. The TPS generation tool 206 maps each logical testing resource referenced in each test procedure 135 to an appropriate testing resource 105 using the driver information 228. The TPS generation tool 206 uses the signal flow information 232 and the driver information 228 to add appropriate functionality to each test program 133 that enables each such mapped testing resource 105 to be communicatively coupled to an appropriate test point and to otherwise implement the operations specified in the respective test procedure 135 (for example, by including functionality to invoke appropriate actions identified in the driver information 228 for each such mapped testing resource 105). The resulting test programs 133 are ultimately installed on and executed by the host computer 104 in order to test the current UUT 112.

The repository 214 also stores one or more test-specification templates 238. Each test-specification template 238, in the embodiment shown in FIG. 2, is used to generate an ARINC 625-1 test specification. Each test-specification template 238 is associated with a particular UUT 112. The test-specification template 238 comprises one or more sections 239 (for example, the various sections specified by the ARINC 625-1 standard). Each section 239 includes static portions and/or dynamic portions. The static portions comprise static text and/or images. The dynamic portions, for example, identify one or more fields that are associated with a particular type of data stored in the repository 214 and one or more test patterns 236. As described below, each test-specification template 238 is used to generate a test specification 134 for the associated UUT 112 by populating each such field with appropriate information stored in the repository 214 and, for each test pattern 236 specified in the test-specification template 238, instantiating a test procedure 135 for each signal group of the group type associated with that test pattern 236.

Figure 9:
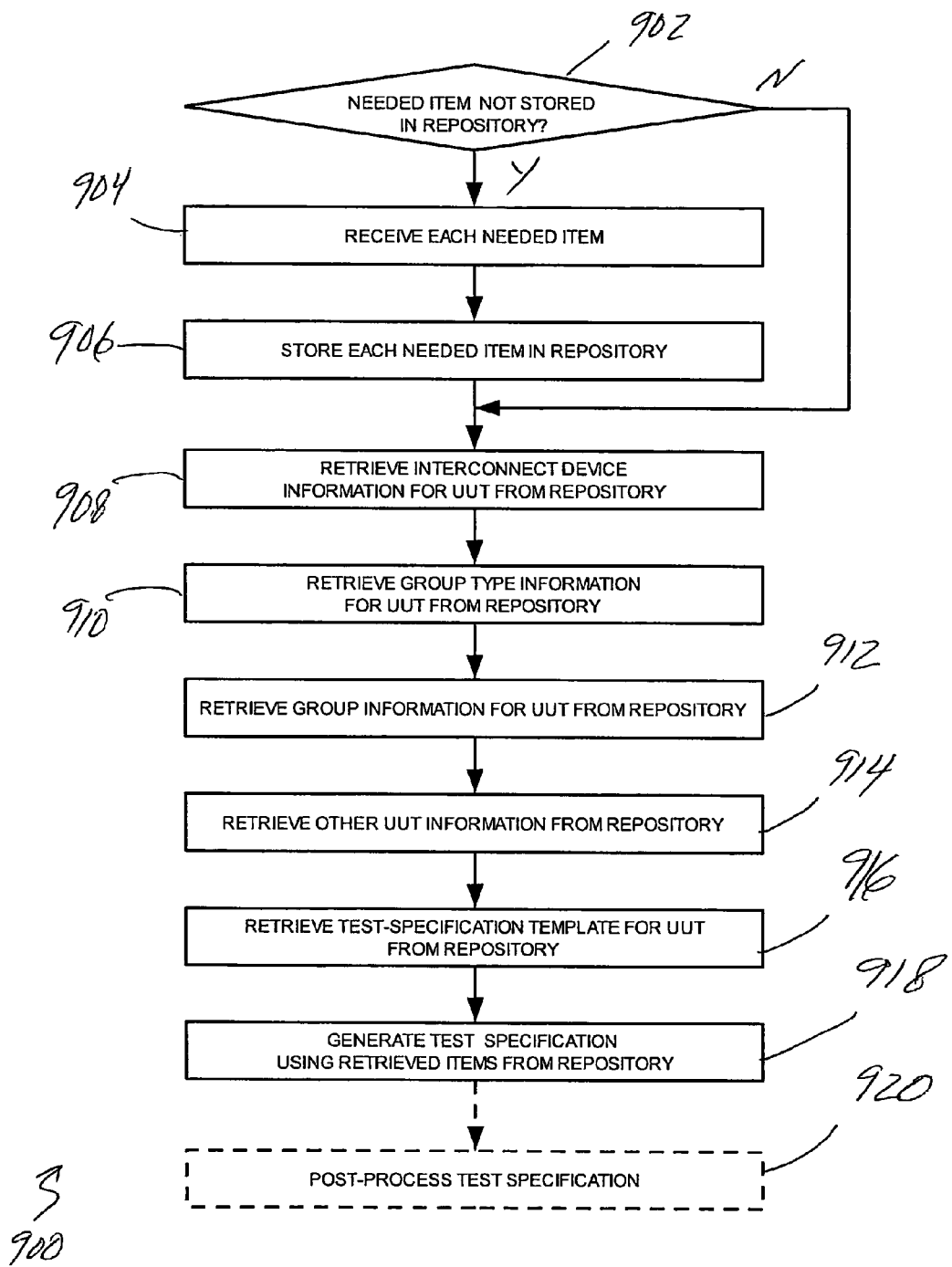
FIG. 9 is a flow diagram of one embodiment of a method of generating a test specification in an automated manner.

FIG. 9 is a flow diagram of one embodiment of a method 900 of generating a test specification in an automated manner. The embodiment of method 900 shown in FIG. 9 is described here as being implemented using the development environment 200 shown in FIG. 2. In such an embodiment, method 900 is performed, at least in part, by the test specification generation tool 205 and is performed in order to generate a test specification 134 for a particular UUT 112 and ATE platform 102. In the context of the description of FIG. 9, the test specification 134 that is being generated for a particular UUT 112 and a particular ATE platform 102 is referred to here as the "current test specification" 134. The particular UUT 112 and ATE platform 102 for which the current test specification 134 is being generated are referred to here in the context of FIG. 9 as the "current UUT" 112 and the "current ATE platform" 102, respectively. Other embodiments of method 900 are implemented in other ways. For example, in the exemplary embodiment shown in FIG. 9, the processing of method 900 is shown, for the purposes of illustration, as occurring in a particular order. It is to be understood that in other embodiments, the processing of method 900 is arranged in different ways.

Any items needed to generate the current test specification 134 for the current UUT 112 that are not stored in the repository 214 (checked in block 902) are received (block 904) and stored in the repository 214 (block 906). In the embodiment shown in FIG. 9, the test specification generation tool 205 receives any needed items from a source external to the test specification generation tool 205 and stores them in the repository 214. Examples of such items include items of UUT information 216 (such as group type information 219, group information 218, an interconnect definition 222, and other UUT information 223), vocabulary 234, test patterns 236, and a test-specification template 238. In one implementation, a user of the test specification generation tool 205 uses other software to prepare an electronic document (for example, a spreadsheet or a text document) that contains one or more needed items of information. For example, in one usage scenario, the user references appropriate requirements documents for the UUT 112 (such as a software requirements specification, product requirements specification, and/or software maintenance manual) for such items. The electronic document is received by test specification generation tool 205, which extracts the need items from the electronic document. In other implementations, at least some of the needed items are contained within a requirements documents and are tagged (or otherwise identified) in a manner that allows the needed items to be automatically extracted from such documents by the test specification generation tool 205 (and/or by other extraction software). In other implementations, at least some of the needed items are manually input into the test specification generation tool 205 by a user thereof (for example, by interacting with a graphical user interface that guides the user through the input process). In other embodiments, the needed items are received in other ways.

Method 900 further comprises retrieving from the repository 214 an interconnect definition 222 for the current UUT 112 (block 908), group type information 219 for the current UUT 112 (block 910), the group information 218 for the current UUT 112 (block 912), any other UUT information 223 for the current UUT 112 (block 914), and a test-specification template 238 for the current UUT 112 (block 916).

Method 900 further comprises generating the current test specification 134 from the retrieved test-specification template 238 using the items of information retrieved from the repository. 214 (block 918). In the embodiment shown in FIG. 9, the test specification generation tool 205 generates the current test specification 134 by populating any fields included in retrieved test-specification template 238 with appropriate information stored in the repository 214. Also, for each test pattern 236 specified in the test-specification template 238, a test procedure 135 is instantiated by the test specification generation tool 205 for each signal group specified in the test-specification template 238 for that test pattern 236. Each such signal group has a group type that is the same as the group type associated with the respective test pattern 236 and each logical signal name referenced in the respective test pattern 236 is replaced with a respective UUT signal mapped to that logical signal name in by that signal group. One example of a portion of a test specification 134 is shown in FIG. 10. Each set of test procedures that is generated by the test specification generation tool 205 is inserted into the current test specification 134 as indicated by the retrieved test-specification template 238.

Method 900 further comprises post-processing the generated current test specification 134 (block 920). In the embodiment shown in FIG. 9, such post-processing is performed with tools other than the test specification generation tool 205 (and accordingly is shown in FIG. 9 using dashed lines). For example, in one usage scenario, a user post-processes the current test specification 134 generated by the test specification generation tool 205 using a word processor to edit the current test specification 134 as needed. Such post-processing allows a user to "clean up" the current test specification 134 that is generated by the test specification generation tool 205.

Figure 11:
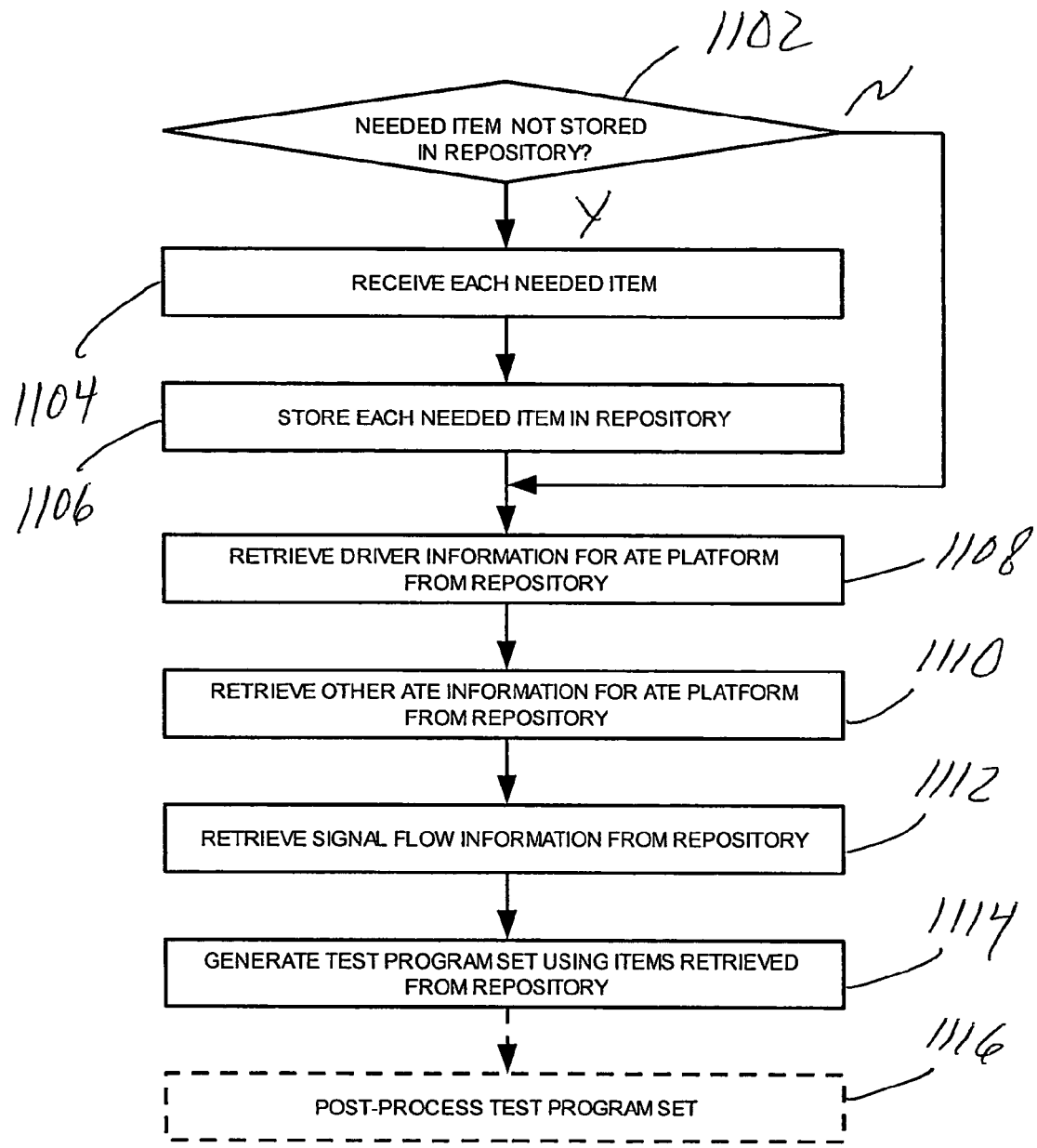
FIG. 11 is a flow diagram of one embodiment of a method of generating a test program set in an automated manner.

FIG. 11 is a flow diagram of one embodiment of a method 1100 of generating a test program set in an automated manner. The embodiment of method 1100 shown in FIG. 11 is described here as being implemented using the development environment 200 shown in FIG. 2. In such an embodiment, method 1100 is performed, at least in part, by the test program set generation tool 206 and is performed in order to generate a test program set 130 for a particular UUT 112 and ATE platform 102. In the context of the description of FIG. 11, the test program set 130 that is being generated for a particular UUT 112 and a particular ATE platform 102 is referred to here as the "current test program set" 130 or "current TPS" 130. The particular UUT 112 and ATE platform 102 for which the current TPS 130 is being generated are referred to here in the context of FIG. 11 as the "current UUT" 112 and the "current ATE platform" 102, respectively. Other embodiments of method 1100 are implemented in other ways. For example, in the exemplary embodiment shown in FIG. 11, the processing of method 1100 is shown, for the purposes of illustration, as occurring in a particular order. It is to be understood that in other embodiments, the processing of method 1100 is arranged in different ways.

Any items needed to generate the current test program set 130 for the current UUT 112 that are not stored in the repository 214 (checked in block 1102) are received (block 1104) and stored in the repository 214 (block 1106). In the embodiment shown in FIG. 11, the TPS generation tool 206 receives any needed items from a source external to the TPS generation tool 206 and stores them in the repository 214. Examples of such items include items of ATE information 226 (such as driver information 228 and other ATE information 233) and signal flow information 232. In one implementation, a user of the TPS generation tool 206 uses other software to prepare an electronic document (for example, a spreadsheet or a text document) that contains one or more needed items of information. For example, in one usage scenario, the user references appropriate manuals or other documents for the ATE platform 102 or UUT 112 for such items. The electronic document is received by TPS generation tool 206, which extracts the need items from the electronic document. In other implementations, at least some of the needed items are contained within a manual or other document and are tagged (or otherwise identified) in a manner that allows the needed items to be automatically extracted from such manuals or documents by the TPS generation tool 206 (and/or by other extraction software). In other implementations, at least some of the needed items are manually input into the TPS generation tool 206 by a user thereof (for example, by interacting with a graphical user interface that guides the user through the input process). In other embodiments, the needed items are received in other ways.

Method 1100 further comprises receiving from the repository 214 driver information 228 for the current ATE platform 102 (block 1108), other ATE information 233 for the current ATE platform 102 (block 1110), and signal flow information 232 for the current UUT 112 and the current ATE platform 102 (block 1112).

Method 1100 further comprises generating the current test program set 130 for the current UUT 112 and current ATE platform 102 using the items retrieved from the repository 214 (block 1114). In the embodiment shown in FIG. 11, the TPS generation tool 206 generates the current test program set 130 by translating each of the set of test procedures 135 instantiated for the test specification 134 into a respective test program 133, expressed in a suitable high-level testing language. The TPS generation tool 206 maps each logical testing resource referenced in each test procedure 135 to an appropriate testing resource 105 using the driver information 228. The TPS generation tool 206 uses the signal flow information 232 and the driver information 228 to add appropriate functionality to each test program 133 that enables each such mapped testing resource 105 to be communicatively coupled to an appropriate test point and to otherwise implement the operations specified in the respective test procedure 135 (for example, by including functionality to invoke appropriate actions identified in the driver information 228 for each such mapped testing resource 105). The resulting test programs 133 are ultimately installed on and executed by the host computer 104 in order to test the current UUT 112.

Method 1100 further comprises post-processing the generated current test program set 130 (block 1116). In the embodiment shown in FIG. 11, such post-processing is performed with tools other than the TPS generation tool 206 (and accordingly is shown in FIG. 11 using dashed lines). For example, in one usage scenario, a user post-processes the current test program set 130 generated by the TPS generation tool 206 using a text editor in order to edit one or more of the test programs 133 included in the current test program set 130 as needed. Such post-processing allows a user to "clean up" the current test program set 130 that is generated by the TPS generation tool 206.

In one embodiment, each test procedure 135 and test program 133 included in a test specification 134 and test program set 130, respectively, for a given UUT 112 has an associated tag that is used, among other things, to identify the UUT 112 and/or ATE platform 102 for which the respective test procedure 135 and test program 133 was generated and/or to identify those items of information stored in the repository 214 from which the respective test procedure 135 and test program 133 were generated. The tag associated with each test procedure 135 included in a test specification 134 is also referred to here as a "test procedure tag." The tag associated with each test program 133 included in a test program set 130 is also referred to here as a "test program tag."

Figure 12:
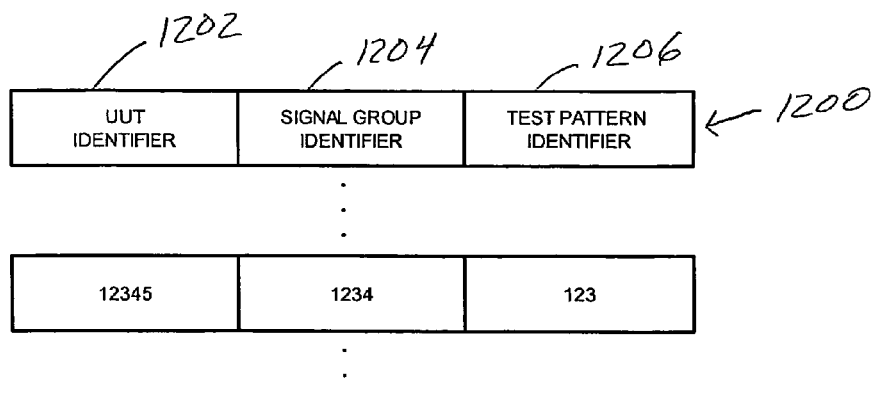
FIG. 12 is a block diagram illustrating one example of a test procedure tag.

FIG. 12 is a block diagram illustrating one example of a test procedure tag 1200. The particular test procedure tag 1200 shown in FIG. 12 is described here as being implemented using the development environment 200 shown in FIG. 2. In such an embodiment, the test procedure tag 1200 is generated by the test specification generation tool 205 for a particular test procedure 135 during the generation of a test specification 134 for a particular UUT 112.

In the context of the description of FIG. 12, the test procedure 135 for which the test procedure tag 1200 is being generated is referred to here as the "current test procedure" 135 and the test specification 134 in which the current test procedure 135 is included is referred to here as the "current test specification" 134. The particular UUT 112 for which the current test specification 134 is being generated is referred to here in the context of FIG. 12 as the "current UUT" 112. In other embodiments, each test procedure 135 is identified in other ways (for example, using a test procedure tag including different data and/or having a different format).

In the example shown in FIG. 12, the test procedure tag 1200 comprises a UUT identifier 1202. The UUT identifier 1202 comprises information (for example, one or more numbers, letters, and/or other symbols) that identifies the current UUT 112. For example, in one implementation of such an embodiment, the UUT identifier 1202 comprises a UUT part number that is stored in the repository 214 (for example, as a part of the other UUT information 223) for the current UUT 112.

In the example shown in FIG. 12, the test procedure tag 1200 further comprises a signal group identifier 1204. The signal group identifier 1204 comprises information (for example, one or more numbers, letters, and/or other symbols) that identifies the particular signal group information 218 associated with the current test procedure 135. For example, in one implementation, the signal group identifier 1204 comprises a signal group number included the group information 218 for the signal group associated with the current test procedure 135.

In the example shown in FIG. 12, the test procedure tag 1200 further comprises a test pattern identifier 1206. The test pattern identifier 1206 comprises information (for example, one or more numbers, letters, and/or other symbols) that identifies the particular test pattern 236 associated with the current test procedure 135. For example, in one implementation, the test pattern identifier 1206 comprises a test pattern number included in the particular test pattern 236 associated with the current test procedure 135.

The test procedure tag 1200 that is generated for the current test procedure 135 can subsequently be-used to identify the current UUT 112, the signal group for which that test procedure 135 was created, and the test pattern 236 used to generate the test procedure 135. In one embodiment, the test procedure tag 1200 generated for a given test procedure 135 is included in the test specification 134 (one example of which is shown in FIG. 10).

Figure 13:
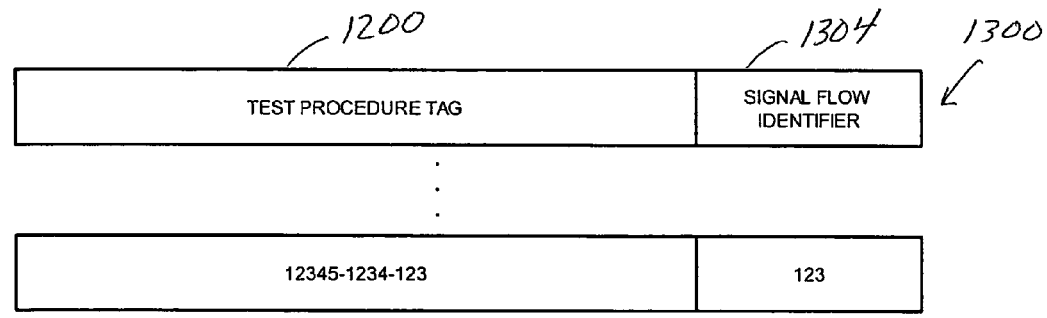
FIG. 13 is a block diagram illustrating one example of a test program tag.

FIG. 13 is a block diagram illustrating one example of a test program tag 1300. The particular test program tag 1300 shown in FIG. 13 is described here as being implemented using the development environment 200 shown in FIG. 2. In such an embodiment, the test program tag 1300 is generated by the TPS generation tool 206 for a particular test program 133 during the generation of a test program set 130 for a particular UUT 112 and ATE platform 102. In the context of the description of FIG. 13, the test program 133 for which the test program tag 1300 is being generated is referred to here as the "current test program" 133 and the test program set 130 in which the current test program 133 is included is referred to here as the "current test program set" 130. The particular UUT 112 and ATE platform 102 for which the current test program set 130 is being generated are referred to here in the context of FIG. 13 as the "current UUT" 112 and the "current ATE platform 102," respectively. The particular test procedure 135 associated with the current test program 133 is also referred to here in the context of FIG. 13 as the "current test procedure" 135. In other embodiments, each test program 133 is identified in other ways (for example, using a test program tag including different data and/or having a different format).

In the example shown in FIG. 13, the test program tag 1300 comprises the test procedure tag 1200 (described above in connection with FIG. 12) for the test procedure 135 associated with the current test program 133. The test program tag 1300 further comprises a signal flow identifier 1304. The signal flow identifier 1304 comprises information (for example, one or more numbers, letters, and/or other symbols) that identifies the particular item of signal flow information 232 used to generate the current test program 133. For example, in one implementation of such an embodiment, the signal flow identifier 1304 comprises a signal flow number associated with the signal flow information 232 used to generate the current test program 133 (for example, as a part of the signal flow information 232 stored in the repository 214).

In one embodiment, when the current test program 133 is executed on the current ATE platform 102, any data that is saved by the current test program 133 (for example, any test results) is associated with the test program tag 1300. The test program tag 1300 can subsequently be used to identify the test procedure 135 associated with the current test program 133 and (by parsing the test procedure tag 1200) the current UUT 112, the signal group for which that test procedure 135 and the current test program 133 were created, and the test pattern 236 used to generate the test procedure 135. The test program tag 1300 can also be used to identify the signal flow information 232 used to generate the current test program 133.

Embodiments of the methods, systems, devices, and techniques described here provide a mechanism to generate a test specification and/or a test program set in an automated manner that enables various inputs to the process of generating a test specification and/or a test program set to be re-used. Such embodiments can reduce the amount of resources used to generate a test specification and/or a test program set for a unit under test (for example, an item of avionics equipment). This is especially desirable in those situations where the generation of a test specification and test program set are the most value-added services performed in the "production" or "service" phase of a given unit under test's lifecycle.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A method comprising:
retrieving a set of test patterns from a repository associated with a unit under test, wherein each test pattern specifies, in a predetermined vocabulary, a set of operations to be performed, wherein each test pattern references a set of logical signal names;
retrieving, from the repository, unit under test information about the unit under test, wherein the unit under test information comprises information about a set of unit under test signals supported by the unit under test;
generating a test specification comprising a set of test procedures using the set of test patterns and the unit under test information, wherein each test procedure is generated by instantiating a respective test pattern, wherein each logical signal name referenced in the respective test pattern is replaced with a respective unit under test signal mapped thereto, and wherein each test pattern specifies a logical testing resource to perform each of the respective set of operations for the respective test pattern;
retrieving, from the repository, automated testing equipment information about an automated testing equipment platform, wherein the automated testing equipment information comprises driver information about a set of drivers by which software executing on a host computer included in the automated test platform accesses a set of testing resources included in the automated testing platform;
retrieving, from the repository, signal flow information, for the unit under test and the automated testing equipment platform, about coupling resource signals supported by the set of testing resources and unit under test signals supported by the unit under test; and
generating a test program set comprising a set of test programs, wherein each test program is generated by translating a respective test procedure into a testing language, wherein each logical testing resource referenced in the respective test procedure is replaced with a testing resource mapped to the logical testing resource by the automated testing equipment information and, for each operation to be performed by that testing resource in accordance with the respective test procedure, the test program invokes, using a respective driver for that testing resource, one or more actions supported by the respective driver in order to implement that operation.

2. The method of claim 1, further comprising, when a particular item of automated testing equipment information needed to generate the test specification is not stored in the repository, receiving the needed item of automated testing equipment information and storing the needed item of automated testing equipment information in the repository.

3. The method of claim 2, further comprising presenting a graphical user interface for entering the needed item of automated testing equipment information, wherein the needed item of automated testing equipment information is received via the graphical user interface.

4. The method of claim 1, further comprising, when a particular item of signal flow information needed to generate the test specification is not stored in the repository, receiving the needed item of signal flow information and storing the needed item of signal flow information in the repository.

5. The method of claim 4, further comprising presenting a graphical user interface for entering the needed item of signal flow information, wherein the needed item of signal flow information is received via the graphical user interface.

6. The method of claim 1, wherein retrieving the automated testing equipment information from the repository comprises reusing at least one item of automated testing equipment information.

7. The method of claim 1, wherein automated testing equipment information about a plurality of automated testing equipment platforms is stored in the repository.

8. The method of claim 1, wherein retrieving the set of test patterns from the repository comprises retrieving a test-specification template from the repository, wherein the test-specification template specifies the set of test patterns for the unit under test.

9. The method of claim 8, wherein the test-specification template further comprises one or more static portions.

10. The method of claim 1, wherein the test-specification template further comprises a set of fields, wherein generating the test specification comprises populating each of the set of fields with appropriate information included in the unit under test information.

11. The method of claim 1, wherein the unit under test information comprises an interconnect definition that specifies the set of unit under test signals supported by the unit under test and, for each of the set of unit under test signals, a respective signal type.

12. The method of claim 1, wherein:
the unit under test information comprises group type information about a set of group types, wherein the group type information, for each of the set of group types, specifies a set of logical signals for the respective group type and, for each of the set of logical signals, a respective signal type;
each test pattern has an associated group type; and
the logical signals referenced by each test pattern are included in the set of logical signals specified for the respective group type associated with the respective test pattern.

13. The method of claim 12, wherein the unit under test information further comprises signal group information about a set of signal groups for the unit under test, wherein the signal group information specifies, for each of the set of signal groups for the unit under test, a respective group type associated with that signal group and, for each of the set of logical signal names of the respective associated group type, a unit under test signal name mapped the respective logical signal.

14. The method of claim 1, further comprising, when a particular item of unit under test information needed to generate the test specification for the unit under test is not stored in the repository, receiving the needed item of unit under test information and storing the needed item of unit under test information in the repository.

15. The method of claim 14, further comprising presenting a graphical user interface for entering the needed item of unit under test information, wherein the needed item of unit under test information is received via the graphical user interface.

16. The method of claim 14, wherein the needed item of unit under test information comprises at least one of: an interconnect definition, a signal group, a group type, and other information about the unit under test.

17. The method of claim 1, further comprising, when a particular test pattern needed to generate the test specification is not stored in the repository, receiving the needed test pattern and storing the needed test pattern in the repository.

18. The method of claim 17, further comprising presenting a graphical user interface for entering the needed test pattern, wherein the needed test pattern is received via the graphical user interface.

19. The method of claim 1, wherein retrieving the set of test patterns from the repository comprises reusing at least one of the set of test patterns.

20. The method of claim 1, wherein retrieving, from the repository, the unit under test information comprises reusing at least one item of unit under test information.

21. The method of claim 1, wherein unit under test information about a plurality of units under test is stored in the repository and wherein a plurality of test patterns are stored in the repository, wherein the set of test patterns for the unit under test comprises a subset of all the test patterns stored in the repository.

22. The method of claim 1, further comprising generating a test procedure tag for each of the set of test procedures, wherein each test procedure tag comprises information indicative of at least one of: the respective unit under test for which the respective test procedure was generated and one or more items of information stored in the repository used to generate the respective test procedure.

23. The method of claim 1, further comprising generating a test program tag for each of the set of test programs, wherein each test program tag comprises information indicative of at least one of: the respective unit under test for which the respective test program was generated, the respective automated test equipment platform for which the respective test program was generated, and one or more items of information stored in the repository that are used to generate the respective test procedure.

24. Development software comprising program instructions embodied on a computer-readable medium that, when executed by a development computer, are operable to cause the development computer to:
  retrieve a set of test patterns from a repository associated with a unit under test, wherein each test pattern specifies, in a predetermined vocabulary, a set of operations to be performed, wherein each test pattern references a set of logical signal names;
  retrieve, from the repository, unit under test information about the unit under test, wherein the unit under test information comprises information about a set of unit under test signals supported by the unit under test;
  generate a test specification comprising a set of test procedures using the set of test patterns and the unit under test information, wherein each test procedure is generated by instantiating a respective test pattern, wherein each logical signal name referenced in the respective test pattern is replaced with a respective unit under test signal mapped thereto, and wherein each test pattern specifies a logical testing resource to perform each of the respective set of operations for the respective test pattern;
  retrieve, from the repository, automated testing equipment information about an automated testing equipment platform, wherein the automated testing equipment information comprises driver information about a set of drivers by which software executing on a host computer included in the automated test platform accesses a set of testing resources included in the automated testing platform;
  retrieve, from the repository, signal flow information, for the unit under test and the automated testing equipment platform, about coupling resource signals supported by the set of testing resources and unit under test signals supported by the unit under test; and
  generate a test program set comprising a set of test programs, wherein each test program is generated by translating a respective test procedure into a testing language, wherein each logical testing resource referenced in the respective test procedure is replaced with a testing resource mapped to the logical testing resource by the automated testing equipment information and, for each operation to be performed by that testing resource in accordance with the respective test procedure, the test program invokes, using a respective driver for that testing resource, one or more actions supported by the respective driver in order to implement that operation.

25. A system comprising:
a development computer;
a repository communicatively coupled to the development computer;
wherein the development computer is operable to:
  retrieve a set of test patterns from a repository associated with a unit under test, wherein each test pattern specifies, in a predetermined vocabulary, a set of operations to be performed, wherein each test pattern references a set of logical signal names;
  retrieve, from the repository, unit under test information about the unit under test, wherein the unit under test information comprises information about a set of unit under test signals supported by the unit under test;
  generate a test specification comprising a set of test procedures using the set of test patterns and the unit under: test information, wherein each test procedure is generated by instantiating a respective test pattern, wherein each logical signal name referenced in the respective test pattern is replaced with a respective unit under test signal mapped thereto, and wherein each test pattern specifies a logical testing resource to perform each of the respective set of operations for the respective test pattern;
  retrieve, from the repository, automated testing equipment information about an automated testing equipment platform, wherein the automated testing equipment information comprises driver information about a set of drivers by which software executing on a host computer included in the automated test platform accesses a set of testing resources included in the automated testing platform;
  retrieve, from the repository, signal flow information, for the unit under test and the automated testing equipment platform, about coupling resource signals supported by the set of testing resources and unit under test signals supported by the unit under test; and generate a test program set comprising a set of test programs, wherein each test program is generated by translating a respective test procedure into a testing language, wherein each logical testing resource referenced in the respective test procedure is replaced with a testing resource mapped to the logical testing resource by the automated testing equipment information and, for each operation to be performed by that testing resource in accordance with the respective test procedure, the test program invokes, using a respective driver for that testing resource, one or more actions supported by the respective driver in order to implement that operation.

26. The system of claim 25, wherein the repository is stored on at least one of a storage medium local to the development computer and a file server.

27. Apparatus comprising:

means for retrieving a set of test patterns from a repository associated with a unit under test, wherein each test pattern specifies, in a predetermined vocabulary, a set of operations to be performed, wherein each test pattern references a set of logical signal names;

means for retrieving, from the repository, unit under test information about the unit under test, wherein the unit under test information comprises information about a set of unit under test signals supported by the unit under test;

means for generating a test specification comprising a set of test-procedures using the set of test patterns and the unit under test information, wherein each test procedure is generated by instantiating a respective test pattern, wherein each logical signal name referenced in the respective test pattern is replaced with a respective unit under test signal mapped thereto, and wherein each test pattern specifies a logical testing resource to perform each of the respective set of operations for the respective test pattern;

means for retrieving, from the repository, automated testing equipment information about an automated testing equipment platform, wherein the automated testing equipment information comprises driver information about a set of drivers by which software executing on a host computer included in the automated test platform accesses a set of testing resources included in the automated testing platform;

means for retrieving, from the repository, signal flow information, for the unit under test and the automated testing equipment platform, about coupling resource signals supported by the set of testing resources and unit under test signals supported by the unit under test; and means for generating a test program set comprising a set of test programs, wherein each test program is generated by translating a respective test procedure into a testing language, wherein each logical testing resource referenced in the respective test procedure is replaced with a testing resource mapped to the logical testing resource by the automated testing equipment information and, for each operation to be performed by that testing resource in accordance with the respective test procedure, the test program invokes, using a respective driver for that testing resource, one or more actions supported by the respective driver in order to implement that operation.

* * * * *

UNITED STATES PATENT AND TRADEMARK OFFICE
CERTIFICATE OF CORRECTION

PATENT NO.       : 7,376,876 B2
APPLICATION NO.  : 11/021410
DATED            : May 20, 2008
INVENTOR(S)      : Raul et al.

It is certified that error appears in the above-identified patent and that said Letters Patent is hereby corrected as shown below:

On the Title page of the patent, item (75); replace inventor "Rajaah K. Vasudevan" with --Rajesh K. Vasudevan--

On the Title page of the patent, item (75); replace "Bangaloro" with --Bangalore-- for inventor Rajesh K. Vasudevan At claim 25, column 18, line 49, replace "under:" with --under--

Signed and Sealed this

Twenty-ninth Day of July, 2008

JON W. DUDAS
*Director of the United States Patent and Trademark Office*